US006379759B2

(12) United States Patent
Kamoi et al.

(10) Patent No.: US 6,379,759 B2
(45) Date of Patent: *Apr. 30, 2002

(54) SEALING AGENT FOR LIQUID CRYSTAL DISPLAY AND LIQUID CRYSTAL DISPLAY USING THE SEALING AGENT

(75) Inventors: Sumio Kamoi, Tokyo; Masao Yoshikawa, Yokohama; Yumi Mochizuki, Yamato, all of (JP)

(73) Assignee: Ricoh Company, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/195,227

(22) Filed: Nov. 18, 1998

(30) Foreign Application Priority Data

Nov. 20, 1997 (JP) ............................................... 9-336491

(51) Int. Cl.$^7$ .................................................. G02B 5/20
(52) U.S. Cl. ......................... 428/1.53; 428/1.1; 428/1.5; 428/1.52; 349/153; 349/190
(58) Field of Search ........................ 428/1.1, 1.5, 1.52, 428/1.53; 349/153, 190; 525/524; 523/428

(56) References Cited

U.S. PATENT DOCUMENTS

| 3,859,379 | A | * | 1/1975 | Kitamura et al. ............ 260/831 |
| 4,001,368 | A | * | 1/1977 | Michizoe et al. ....... 264/176 R |
| 4,214,026 | A | * | 7/1980 | Ibata et al. .................... 428/67 |
| 4,477,610 | A | * | 10/1984 | Ishimura et al. ............. 523/414 |
| 4,833,226 | A | * | 5/1989 | Ishimura et al. ............... 528/45 |
| 4,846,999 | A | * | 7/1989 | Kizaki ................... 252/299.63 |
| 4,940,740 | A | * | 7/1990 | Folda et al. ................. 523/428 |
| 5,360,840 | A | * | 11/1994 | Chan et al. ................. 523/428 |
| 5,688,905 | A | * | 11/1997 | Walker ........................ 528/332 |
| 5,781,263 | A | * | 7/1998 | Kawagoe et al. ........... 349/135 |
| 5,981,111 | A | * | 11/1999 | Irita et al. ....................... 430/7 |

* cited by examiner

Primary Examiner—Blaine Copenheaver
Assistant Examiner—Alicia Chevalier
(74) Attorney, Agent, or Firm—Oblon, Spivak, McClelland, Maier & Neustadt, P.C.

(57) ABSTRACT

A sealing agent for film type liquid crystal displays including a bisphenol type epoxy resin, a non-bisphenol type epoxy resin and a crosslinking agent which includes at least one of an aromatic amine and an alicyclic amine, and a liquid crystal display using the sealing agent.

5 Claims, No Drawings

SEALING AGENT FOR LIQUID CRYSTAL DISPLAY AND LIQUID CRYSTAL DISPLAY USING THE SEALING AGENT

BACKGROUND OF THE INVENTION

1 Field of the Invention

The present invention relates to a sealing agent useful for liquid crystal displays using a plastic film or sheet as a substrate, and to a liquid crystal display using the sealing agent.

2 Discussion of the Background

Liquid crystal displays are widely used as display devices for personal computers, word processors and the like because they are thin and light weight, and consume low power. Among these liquid crystal displays, displays in which glass is used as the substrate of their liquid crystal cells have been typically used (hereinafter referred to as glass type LCDs). Currently, as so-called "mobile devices" are developed and liquid crystal displays are used in the mobile devices, liquid crystal display cells in which a plastic film or sheet is used as the substrate (hereinafter referred to as film type LCDs) have been increasingly used because of their light weight, good flexibility, and resistance to being easily crushed.

Liquid crystal displays are used while liquid crystal is sealed with a sealing agent in a substrate of the liquid crystal displays. The sealing agent preferably has good adhesive strength so as not to be destroyed by a stress applied to the liquid crystal displays using the sealing agent. In addition, the sealing agent is required not to adversely affect molecules of the liquid crystal contacting the sealing agent. Further, the sealing agent which is used for liquid crystal displays having a plastic film substrate preferably has flexibility because the displays are used while they are bent. Furthermore, the sealing agent which is used for liquid crystal displays useful for mobile devices is required to have maximum heat resistance. Thermosetting epoxy resins have been typically used as a sealing agent for liquid crystal displays. In film type LCDs, the crosslinking temperature of the sealing agent cannot be set to be as high as for glass type LCDs because the film or sheet substrate has relatively poor heat resistance compared to the glass substrate. Therefore the sealing agent for the film type LCDs has a drawback of poor heat resistance.

In addition, film type LCDs are required to have flexibility, which glass type LCDs are not required to have. Therefore sealing agents which are different in kind from those used for glass type LCDs have been used for film type LCDs, or sealing agents which are the same kind as those used for glass type LCDs have been used while being crosslinked at a relatively low temperature compared to that for the glass type LCDs. When such film type LCDs are preserved at a high temperature, which is a requisite for the sealing agent, liquid crystal tends to impregnate into the sealing agent, and thereby the sealing agent swells, resulting in decrease of the adhesive strength of the sealing agent layer (a problem hereinafter termed "poor resistance to liquid crystals"). In addition, in this case, the switching current of the liquid crystal tends to increase because of the mixing of the sealing agent in the liquid crystal, resulting in malfunction of the film type LCDs (a problem hereinafter termed "a liquid crystal contamination problem"). Therefore a need exists for a sealing agent having good reliability, without causing these problems.

In attempting to solve these problems, Japanese Laid-Open Patent Publication No. 62-18523 discloses polyol type epoxy resins serving as a sealing agent for film type LCDs. The sealing agent has good flexibility and adhesive strength; however, the sealing agent swells and the switching current of the liquid crystal gradually increases when the film type LCD using the sealing agent is preserved at about 80° C. Thus, this sealing agent cannot entirely address the problem of poor heat resistance.

Japanese Laid-Open Patent Application No. 9-12679 discloses a sealing agent for film type LCDs which includes as the essential components 10 to 50 parts by weight of a silicone-modified epoxy resin which is liquid at room temperature, 90 to 50 parts by weight of a bisphenol type epoxy resin which is also liquid at room temperature, 20 to 80 parts by weight of a trifunctional thiol type crosslinking agent which is also liquid at room temperature, 0.5 to 5.0 parts by weight of a silane coupling agent, 1 to 10 parts by weight of amorphous silica having an average particle diameter not greater than 1 $\mu$m, and 5 to 50 parts by weight of an inorganic filler other than amorphous silica, which has an average particle diameter not greater than 2 $\mu$m. However, the sealing agent also does not entirely improve the heat resistance because the switching current of the liquid crystal gradually increases when the film type LCD using the sealing agent is preserved at about 80° C.

Because of these reasons, a need exists for a sealing agent for film type LCDs which has good flexibility and good heat resistance as well as good resistance to liquid crystals. In addition, a need exists for a film type LCD which successfully addresses the problems mentioned above.

SUMMARY OF THE INVENTION

Accordingly, an object of the present invention is to provide a sealing agent useful for film type LCDs which has good flexibility and good heat resistance as well as good resistance to liquid crystals even when the cells of the film type LCDs are manufactured by an assembling method including heat treatment at a conventional heating temperature.

Another object of the present invention is to provide a film type LCD which uses the above-mentioned sealing agent and which has good heat resistance and good resistance to liquid crystals, and successfully addresses a liquid crystal contamination problem.

Briefly these objects and other objects of the present invention as hereinafter will become more readily apparent can be attained by a sealing agent which includes at least epoxy ingredients of a bisphenol type epoxy resin and a non-bisphenol type epoxy resin, and crosslinking agent ingredients of an aromatic amine compound and/or an alicyclic amine compound.

The non-bisphenol type epoxy resin preferably includes an alcohol type epoxy resin, a polysulfide modified epoxy resin or a silicone oil modified epoxy resin.

The sealing agent preferably includes a crosslinking catalyst including an acid.

In another aspect of the present invention, a film type LCD which includes a plastic film substrate in which a liquid crystal is sealed with the sealing agent mentioned above is also provided.

DETAILED DESCRIPTION OF THE INVENTION

Other features of the invention will become apparent in the course of the following descriptions of preferred embodiments, which are given for the purpose of illustration only and are not intended to be limiting.

The present inventors discovered that the above-described problems can be solved by a sealing agent which includes epoxy ingredients including specified epoxy resins, and a crosslinking agent including a specified amine compound.

In detail description, it was discovered that the resistance to liquid crystals and the liquid crystal contamination problem can be successfully addressed by a sealing agent including a bisphenol type epoxy resin, and an aromatic amine type crosslinking agent and/or an alicyclic amine type crosslinking agent. The reason is considered to be that the non-bisphenol type epoxy resin has a high cohesive force due to having aromatic rings therein and is inactive because of having a high glass transition temperature; thereby the epoxy resins tend to be hardly impregnated with molecules of liquid crystal, resulting in improvement of the resistance to liquid crystals and the liquid crystal contamination problem. By using an aromatic amine and/or alicyclic amine as a crosslinking agent, this effect can be enhanced.

The combination of the bisphenol type epoxy resin and the crosslinking agents of the aromatic amine and/or the alicyclic amine, however, has a drawback in that the resultant sealing agent becomes too hard after crosslinking and tends to be peeled from a substrate when the substrate is stressed.

It was also discovered that this peeling problem can be solved by adding a non-bisphenol type epoxy resin to the bisphenol type epoxy resin. Thus a sealing agent having good resistance to liquid crystals and good resistance to peeling can be obtained.

Thus, there is no criticality with regard to utility in the relative amounts of bisphenol type epoxy resin and non-bisphenol type epoxy resin, so long as each is present in amounts sufficient to produce the above-described effects. Similarly, there is no criticality with regard to utility in the amount of crosslinking agent, so long as it is present in crosslinking amounts.

The term "bisphenol type epoxy resin" herein is intended to have a meaning well-defined in the art, i.e., it contains groups derived from a bisphenol. Similarly, the term "non-bisphenol type epoxy resin" herein is intended to have a meaning well-defined in the art, i.e., it does not contain groups derived from a bisphenol.

Suitable bisphenol type epoxy resins for use in the present invention are not particularly limited and include known bisphenol type epoxy resins. For example, bisphenol A type epoxy resins having the following formula (1) and bisphenol F type epoxy resins having the following formula (2) can be employed.

Bisphenol A Type Epoxy Resin

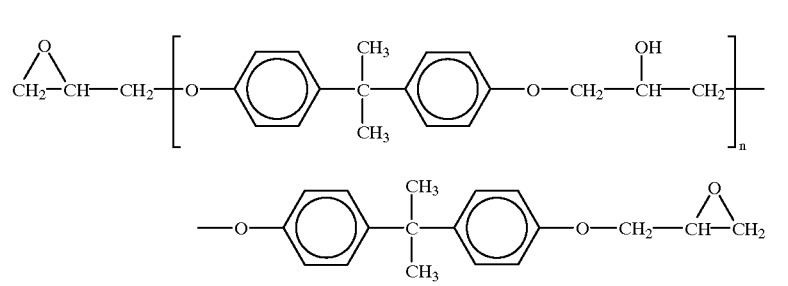

(1)

wherein n is 0 or 1.

Bisphenol F Type Epoxy Resin

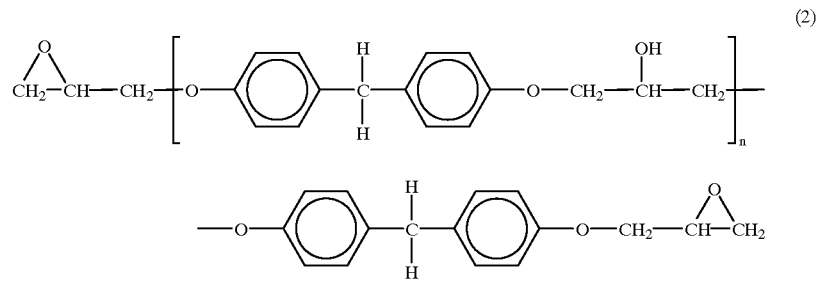

(2)

wherein n is 0 or 1.

Specific examples of such bisphenol A type epoxy resins include EPIKOTE 828, 834, 1001 and 1004, which are manufactured by YUKA SHELL EPOXY KK, and EPI-CLON 850, 860 and 4055, which are manufactured by Dainippon Ink and Chemicals Inc.

Specific examples of such bisphenol F type epoxy resins include EPIKOTE 807, which is manufactured by YUKA SHELL EPOXY) KK, and EPICLON 830, which is manufactured by Dainippon Ink and Chemicals Inc.

These epoxy resins may be employed alone or in combination.

Suitable non-bisphenol type epoxy resins for use in the present invention include alcohol type epoxy resins, polysulfide modified epoxy resins, silicone oil modified epoxy resins and the like. The term "alcohol type epoxy resins" is intended to have a meaning well-defined in the art, i.e., it contains groups derived from an alcoholic hydroxy group.

The alcohol type epoxy resins for use in the present invention include compounds which have a glycidyl ether group which is obtained, for example, by a reaction of an alcoholic hydroxy group and an epichlorohydrin group. Specific examples of such compounds include compounds having a formula selected from the following formulas (3) to (6):

Polyethylene Glycol Type Epoxy Resins

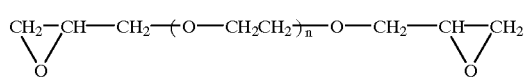

(3)

wherein n is an integer of from 5 to 15.
Propylene Glycol Type Epoxy Resins

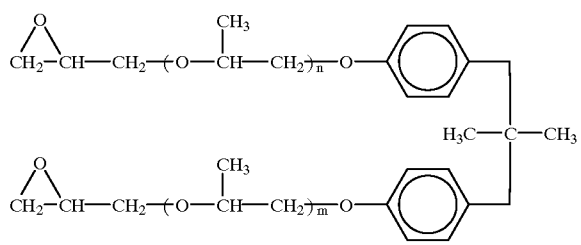

(4)

wherein n and m are an integer and the total number of n and m is 3.

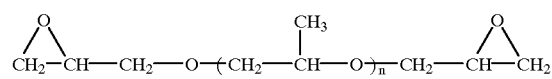

(5)

wherein n is 7.
1,6-hexanediol Digycidylether Type Epoxy Resins

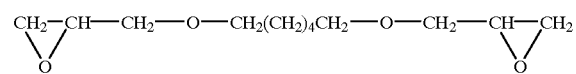

(6)

The polysulfide modified epoxy resins for use in the present invention include compounds having a group —S— in the skeleton of the molecule thereof and epoxy groups (or glycidyl groups) at both ends of the molecule thereof. Specific examples of such compounds include polysulfide modified epoxy resins having the following formula (7):

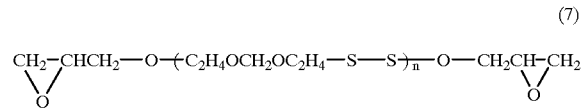

(7)

wherein n is an integer of from 1 to 10.

Specific examples of such polysulfide modified epoxy resins include FLEP-10, FLEP-50, FLEP-60 and FLEP-80 manufactured by TORAY THIOKOL Co., Ltd.

The silicone oil modified epoxy resins for use in the present invention include compounds having a group —SiO— in the skeleton of the molecule thereof and epoxy groups (or glycidyl groups) at both ends of the molecule thereof. Specific examples of such compounds include compounds having the following formula (8):

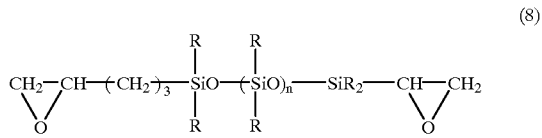

(8)

wherein R represents a methyl group or a phenyl group; and n is an integer of from 1 to 9.

These bisphenol type and non-bisphenol type epoxy resins may include one or more epoxy resins, respectively.

Suitable aromatic amines for use as a crosslinking agent in the present invention include diaminodiphenylmethane (DDM), metaphenylenediamine, diaminodiphenylsulfone, 3, 3'dimethyl-5,5'-diethyl-4,4'-diaminophenylmethane, dimethylethylmethaphenylenediamine, epoxy-adducts of DDM, and the like.

Suitable alicyclic amines for use as a crosslinking agent in the present invention include isophoronediamine, norbornenediamine, cyclohexylenediamine, dimethyldiaminodicyclohexylmethane and the like.

The sealing agent of the present invention may include a crosslinking catalyst to shorten the crosslinking time of the sealing agent and/or to lower the crosslinking temperature. Specific examples of such a crosslinking catalyst include inorganic solid acids such as silica, and organic acids such as salicylic acid.

By including the acid mentioned above in a sealing agent as a crosslinking catalyst, the sealing agent can be crosslinked at a low temperature, for example, lower than 40° C. When a crosslinking catalyst is not employed, sealing agents including an aromatic amine type crosslinking agent such as metaphenylenediamine and diaminodiphenylmethane need to be crosslinked at a temperature higher than 60° C. However, when a crosslinking catalyst is employed together with the crosslinking agent, the sealing agent can be crosslinked at 40° C.

In this crosslinking (first crosslinking), the LCD cell is baked at about 40° C. to obtain a uniform cell gap while the substrate is pressed. Therefore it is preferable to perform the first crosslinking of the sealing agent at such a low temperature as 40° C. or lower because problems such as deformation of the substrate and the so-called "bruise" of the cell can be avoided.

When a particulate silica is used as a crosslinking catalyst, the silica can serve as an acid catalyst because hydroxide groups present on the surface of the silica dissociate to produce hydrogen ions. The particulate silica can also serve as a thickener which is mentioned below.

The sealing agent of the present invention may include a filler to obtain good printing qualities. The sealing agents of LCD cells are formed on substrates of the cells, typically, by a screen printing method. Therefore the viscosity of the sealing agent to be printed is preferably from about 30 to about 50 Pa·s. The viscosity can be controlled by adding a filler to the sealing agent. Specific examples of such fillers include titanium oxide, silica, alumina, calcium carbonate and the like. These fillers can be used alone or in combination.

The fillers can be added to the epoxy ingredients and/or the crosslinking agent, or the mixture of the epoxy ingredients and the crosslinking agent when a sealing agent printing liquid is prepared. A homogenizer or a 3-roll mill is preferably used for mixing the filler and the epoxy ingredients and/or the crosslinking agent. The content of the filler in the sealing agent printing liquid is preferably from 0 to 100 parts by weight per 100 parts by weight of the epoxy ingredients or the crosslinking agent.

The sealing agent of the present invention may include a silane coupling agent to improve adhesive strength. Specific examples of the silane coupling agent include:

γ-glycidoxypropyltrimethoxysilane,
γ-glycidoxypropyltriethoxysilane,
γ-glycidoxypropylmethyldiethoxysilane,
β(3,4-epoxycyclohexyl)ethyltrimethoxysilane,
γ-aminopropyltrimethoxysilane,
N-β-(aminoethyl)-γ-aminopropyltrimethoxysilane, and the like.

The content of the silane coupling agent in the sealing agent is generally from 0.5 to 20 parts by weight, and preferably from 1 to 10 parts by weight, per 100 parts by weight of the epoxy ingredients.

Suitable resin films for use as the substrate of the cells of the film type LCDs of the present invention include polycarbonate films, polyethersulfone films, polysulfone films and the like. Since these films have large gas transmittance and poor resistance to solvents, a gas barrier layer and/or a protective layer made by an inorganic or organic material can be formed. In addition, an ITO layer is formed thereon. The total thickness of the substrate is from about 0.1 to about 0.3 mm.

As for a method for measuring the resistance to liquid crystals, the following method has been developed:
(1) crosslinking a sealing agent;
(2) weighing the crosslinked sealing agent;
(3) dipping the crosslinked sealing agent in a liquid crystal at a high temperature for a predetermined time; and
(4) then measuring the resistivity of the liquid crystal, or weighing the sealing agent after the preservation to determine the weight ratio of the sealing agent after the preservation to that before preservation (hereinafter this weight ratio is referred to as "swelling degree").

When the resistance of the sealing agent to liquid crystals is poor, the resistivity of the liquid crystal after the preservation is relatively low and the swelling degree of the sealing agent is relatively large, because one or more ingredients of the sealing agent migrate into the liquid crystal, and the sealing agent is impregnated with the liquid crystal, resulting in swelling of the sealing agent. Namely, the higher the resistivity of the liquid crystal or the more closely the swelling degree approaches 1, the better the resistance of the sealing agent to the liquid crystal.

The resin film type LCD (hereinafter PF-LCD) of the present invention can be manufactured, for example, by the following method.

One or more resin films which are formed with an ITO electrode are used as a substrate of the LCD. A pattern is formed thereon by any known method such as photolithography and the like. After the substrate is washed, an orientating layer which is of any pattern and which is made of polyamide, polyimide or the like is printed thereon by flexagraphy. The substrate is baked at a predetermined temperature and then subjected to rubbing treatment. The dust of the rubbing treatment is ultrasonically dry-cleaned. Windows are formed in the substrate for setting an electrode terminal therein (this process hereinafter referred to as a "precutting process").

In addition, in order to perfectly remove dust, the substrate is ultrasonically cleaned with water (ultrasonic cleaning with water at frequencies of from 30 to 60 KHZ followed by ultrasonic cleaning with water at frequencies of about 1 MHZ).

Spherical particles of a resin or an inorganic material are sprinkled on one of the film substrates to make the gap of a resultant LCD cell uniform. The sealing agent of the present invention is formed on the other film substrate by a screen printing and then the two substrates are laminated with each other so that the two substrates are aligned. The pair of substrates laminated are set in an air bag type pressure applying oven, and then sealed and baked at a temperature not higher than 60° C. The pair of substrates sealed are cut to form a plurality of cells (when LCD cells are manufactured, a method in which a large substrate consisting of a plurality of cells are cut to form LCD cells is generally used). The cut cells are further baked at a high temperature higher than 100° C. to accelerate the crosslinking reaction of the sealing agent.) In this case the cells are baked without pressure while being contained in a jig such as a cassette.

A liquid crystal is charged into the cells by a vacuum charging method utilizing pressure difference. After the charging of the liquid crystal, the cell is excessively charged; with the liquid crystal and the gap of the cell is not uniform. Therefore the cell is pressed to extrude the excess liquid crystal therefrom and then sealed. In this case the closing is preferably performed with an ultraviolet crosslinking resin, and may be performed with an epoxy type heat crosslinking resin.

A deflecting plate with or without a phase plate is adhered on the front side of the cells (a deflecting plate is used for TN type liquid crystals and a deflecting plate with a phase plate for STN type liquid crystals). On the rear side of the cells, a deflecting plate with a reflection plate or a semi-transparent plate is adhered to form a reflection type or a semi-transparent panel. The thus formed LCD unit is then implemented with a driving circuit and a connector connecting the driving circuit with the unit.

Currently, various thin information terminals such as portable phones, personal handy phones, card pagers and the like are developed and manufactured. Liquid crystals suitable for these terminals preferably are of STN type whose duty ratio is from 1/16 to 1/64 and which can work with a low voltage and have quick responding properties.

A liquid crystal material which is charged in a cell of an LCD is typically made by mixing about 10 kinds of liquid crystals while controlling the mixing ratio, which depends on a requisite property of the PF-LCD. It is discovered that when the requisite property is low-voltage operating or quick response, the liquid crystal material tends to be affected by materials surrounding the liquid crystal material. In detail description, when the liquid crystal material having a threshold voltage (Vth) not greater than 1.5 V and dielectric anisotropy $\Delta\in$ not less than 10 is used, the liquid crystal material tends to be particularly affected by the surrounding materials such as a sealing agent, and problems tend to occur in that current consumption of the LCD increases due to the increase of the resistivity of the liquid crystal material and deflecting properties thereof deteriorate. Since the sealing agent of the present invention hardly affects liquid crystal materials, the sealing agent is particularly effective for PF-LCDs, which includes a liquid crystal material which can work at a low voltage and which tends to be affected by the surrounding materials. Namely, by using the sealing agent of the present invention for a PF-LCD, the PF-LCD has good reliability, which cannot be attained by conventional sealing agents.

EXAMPLES

Having generally described this invention, further understanding can be obtained by reference to certain specific examples which are provided herein for the purpose of illustration only and are not intended to be limiting. In the descriptions In the following examples, the numbers represent weight ratios in parts, unless otherwise specified.

Example 1

The following epoxy components were mixed with a homogenizer and a three-roll mill to prepare an epoxy resin composition.

Epoxy Resin Composition

| | |
|---|---|
| Highly pure bisphenol A type epoxy resin | 70 |
| (EPIKOTE YL-980, manufactured by YUKA SHELL EPOXY KK) | |
| Alcohol type difunctional epoxy resin | 30 |
| (GLYCI-ALE BPP350, manufactured by Sanyo Chemical Industries Ltd.) | |
| Titanium oxide | 20 |
| (P-25, manufactured by Nippon Aerosil Co.) | |
| Amorphous silica | 10 |
| (R-805, manufactured by Nippon Aerosil Co.) | |
| Silane coupling agent | 7 |
| (KBM403, manufactured by Shin-Etsu Silicone Co., Ltd) | |

The following components were mixed with a homogenizer to prepare a crosslinking agent composition.

Crosslinking Agent Composition

| | |
|---|---|
| Aromatic amine type crosslinking agent | 100 |
| (ANKAMINE Z, manufactured by ACI JAPAN Co., Ltd.) | |
| Amorphous silica | 5 |
| (R-805, manufactured by Nippon Aerosil Co.) | |

Twenty-seven (27) parts of the epoxy resin composition and three (3) parts of the crosslinking agent composition were mixed to prepare a sealing agent of the present invention, and the sealing agent was heated at 60° C. for 5 hours and then heated at 120° C. for 2 hours to crosslink the mixture.

One tenth (0.1) grams of the crosslinked sealing agent were added to 1.2 ml of a liquid crystal (RDP-60429E059, manufactured by LODIC Co., Ltd.) and the liquid crystal including the crosslinked sealing agent was preserved in a location at 85° C. for 4 days.

After the preservation, the resistivity of the liquid crystal and the swelling degree of the crosslinked sealing agent were measured. As a result, the resistivity was $3.0 \times 10^{10} \Omega$ cm and the swelling degree was 1.00 (namely, the crosslinked sealing agent was not swelled).

In addition, the adhesive strength of the sealing agent was measured by the following method:
(1) preparing a film having an ITO layer (AM7015C type F-100-300, manufactured by Teijin Ltd.);
(2) removing the ITO layer by etching treatment;
(3) printing the sealing agent on the ITO-removed surface of the film;
(4) overlaying another ITO-removed film on the film so that the sealing agent was sandwiched;
(5) crosslinking the sealing agent under the conditions mentioned above;
(6) peeling the two films so that the peel angle was 90° to measure a peel strength, i.e., the adhesive strength.

The adhesive strength was 320 gf/5 mm, which was an adequate level. The peeling occurred at the interface between the film and the sealing agent.

Further, an STN panel having a duty ratio of 1/32 was prepared in the same way es mentioned above in the manufacturing method of the PF-LCD. The sealing agent used was the sealing agent mentioned above and the liquid crystal used was RDP 60429E059, which was manufactured by LODIC Co., Ltd., and whose threshold voltage (Vth) was 1.38V and the dielectric anisotropy $\Delta\in$ was 12.9. The sealing agent was crosslinked by being heated at 60° C. for 5 hours and then heated at 120° C. for 2 hours.

The thus prepared panel was evaluated with respect to changing rate of current consumption (R/R0) which was measured as follows:
(1) measuring current consumption (R0) of the panel before the test;
(2) measuring current consumption (R) of the panel after the panel was preserved under each condition of 85° C. for 500 hours (condition (1)) and 60° C. 90%RH for 500 hours (condition (2)); and
(3) obtaining the changing rate of current consumption R/R0.

In addition, the panel was visually observed to determine whether an orientation fault occurred in the liquid crystal around the sealing agent after the panel was preserved under the two conditions (1) and (2) described above.

The results are shown in Table 1.

Example 2

The procedures for preparation and evaluation of the sealing agent and the PF-LCD in Example 1 were repeated except that the epoxy resin composition and the crosslinking agent composition were changed to the following, the mixing ratio of the epoxy resin composition to the crosslinking agent was changed to 75/10 and the liquid crystal used for the PF-LCD was changed to RPD60429 (manufactured by LOGIC Co., Ltd., Vth of 1.38 V, $\Delta\in$ of 12.9):

Epoxy Resin Composition

| | |
|---|---|
| Highly pure bisphenol A type epoxy resin (EPIKOTE YL-980, manufactured by YUKA SHELL EPOXY KK) | 50 |
| Alcohol type difunctional epoxy resin (GLYCI-ALE BPP350, manufactured by Sanyo Chemical Industries Ltd.) | 50 |
| Titanium oxide (P-25, manufactured by Nippon Aerosil Co.) | 20 |
| Amorphous silica (R-805, manufactured by Nippon Aerosil Co.) | 8 |
| Silane coupling agent (KBM403, manufactured by Shin-Etsu Silicone Co., Ltd) | 5 |

Crosslinking Agent Composition

| | |
|---|---|
| Aromatic amine type crosslinking agent (ANKAMINE Z, manufactured by ACI JAPAN Co., Ltd.) | 100 |
| Amorphous silica (R-805, manufactured by Nippon Aerosil Co.) | 5 |

Example 3

The procedures for preparation and evaluation of the sealing agent and the PF-LCD in Example 1 were repeated except that the epoxy resin composition and the crosslinking agent composition were changed to the following, the mixing ratio of the epoxy resin composition to the crosslinking agent was changed to 90/15 and the liquid crystal used for PF-LCD was changed to RC4087 (manufactured by Chisso Corp., Vth of 1.38 V, $\Delta\in$ of 12.4).

Epoxy Resin Composition

| | |
|---|---|
| Highly pure bisphenol A type epoxy resin (EPIKOTE YL-980, manufactured by YUKA SHELL EPOXY KK) | 90 |
| Alcohol type difunctional epoxy resin (GLYCI-ALE BP300P, manufactured by Sanyo Chemical Industries Ltd.) | 10 |
| Titanium oxide (P-25, manufactured by Nippon Aerosil Co.) | 20 |
| Alumina ($Al_2O_3$—C, manufactured by Nippon Aerosil Co.) | 8 |
| Silane coupling agent (KBM403, manufactured by Shin-Etsu Silicone Co., Ltd) | 3 |

Crosslinking agent composition

| | |
|---|---|
| Aromatic amine type crosslinking agent (ANKAMINE Z, manufactured by ACT JAPAN Co., Ltd.) | 100 |
| Amorphous silica (R-805, manufactured by Nippon Aerosil Co.) | 5 |

Example 4

The procedures for preparation and evaluation of the sealing agent and the PF-LCD in Example 3 were repeated except that the epoxy resin composition and the crosslinking agent composition were charged to the following, and the mixing ratio of the epoxy resin composition to the crosslinking agent was changed to 100/50.

Epoxy Resin Composition

| | |
|---|---|
| Highly pure bisphenol A type epoxy resin (EPIKOTE YL-980, manufactured by YUKA SHELL EPOXY KK) | 90 |
| Alcohol type difunctional epoxy resin (GLYCI-ALE PP300P, manufactured by Sanyo Chemical Industries Ltd.) | 10 |
| Titanium oxide (P-25, manufactured by Nippon Aerosil Co.) | 20 |
| Alumina ($Al_2O_3$—C, manufactured by Nippon Aerosil Co.) | 8 |
| Silane coupling agent (KBM403, manufactured by Shin-Etsu Silicone Co., Ltd) | 4 |

Crosslinking Agent Composition

| | |
|---|---|
| Aromatic amine type crosslinking agent (EH-531, manufactured by Asahi Denka Kogyo K.K.) | 100 |
| Amorphous silica (R-805, manufactured by Nippon Aerosil Co.) | 5 |

Example 5

The procedures for preparation and evaluation of the sealing agent and the PF-LCD in Example 3 were repeated except that the epoxy resin composition and the crosslinking agent composition were changed to the following, and the mixing ratio of the epoxy resin composition to the crosslinking agent was changed to 90/13.

Epoxy Resin composition

| | |
|---|---|
| Highly pure bisphenol A type epoxy resin (EPIKOTE YL-980, manufactured by YUKA SHELL EPOXY KK) | 90 |
| Alcohol type trifunctional epoxy resin (HEROXY HM-505P, manufactured by YUKA SHELL EPOXY KK) | 10 |
| Titanium oxide (P-25, manufactured by Nippon Aerosil Co.) | 20 |
| Alumina ($Al_2O_3$—C, manufactured by Nippon Aerosil Co.) | 8 |
| Silane coupling agent (KBM403, manufactured by Shin-Etsu Silicone Co., Ltd) | 2 |

Crosslinking Agent Composition

| | |
|---|---|
| Aromatic amine type crosslinking agent (ANKAMINE Z. manufactured by ACT JAPAN Co., Ltd.) | 100 |
| Amorphous silica (R-805, manufactured by Nippon Aerosil Co.) | 5 |

Example 6

The procedures for preparation and evaluation of the sealing agent and the PF-LCD in Example 3 were repeated except that the epoxy resin composition and the crosslinking agent composition were changed to the following, the mixing ratio of the epoxy resin composition to the crosslinking agent was changed to 86/10 and the duty ratio of the PF-LCD was changed to 1/64.

Epoxy Resin Composition

| | |
|---|---|
| Highly pure bisphenol A type epoxy resin (EPIKOTE YL-980, manufactured by YUKA SHELL EPOXY KK) | 50 |
| Polysulfide modified epoxy resin (FLEP-50, manufactured by TORAY THIOKOL Co., Ltd.) | 50 |
| Titanium oxide (P-25, manufactured by Nippon Aerosil Co.) | 40 |
| Alumina ($Al_2O_3$—C, manufactured by Nippon Aerosil Co.) | 10 |
| Silane coupling agent | 5 |

Crosslinking Agent Composition

| | |
|---|---|
| Aromatic amine type crosslinking agent (ANKAMINE Z. manufactured by ACI JAPAN Co., Ltd.) | 100 |
| Amorphous silica (R-805, manufactured by Nippon Aerosil Co.) | 5 |

Example 7

The procedures for preparation and evaluation of the sealing agent and the PF-LCD in Example 2 were repeated except that the epoxy resin composition and the crosslinking agent composition were charged to the following, and the mixing ratio of the epoxy resin composition to the crosslinking agent was changed to 46/10.

Epoxy Resin Composition

| | |
|---|---|
| Highly pure bisphenol A type epoxy resin (EPIKOTE YL-980, manufactured by YUKA SHELL EPOXY KK) | 90 |
| Alcohol type difunctional epoxy resin (GLYCI-ALE BPP350, manufactured by Sanyo Chemical Industries Ltd.) | 10 |
| Titanium oxide (P-25, manufactured by Nippon Aerosil Co.) | 20 |
| Alumina ($Al_2O_3$—C, manufactured by Nippon Aerosil Co.) | 8 |
| Silane coupling agent (KBM403, manufactured by Shin-Etsu Silicone Co., Ltd)) | 5 |

Crosslinking Agent Composition

| | |
|---|---|
| Alycyclic amine type crosslinking agent (EPIKURE 113, manufactured by YUKA SHELL EPOXY KK) | 100 |
| Amorphous silica (R-805, manufactured by Nippon Aerosil Co.) | 10 |

Example 8

The procedures for preparation and evaluation of the sealing agent and the PF-LCD in Example 1 were repeated except that the epoxy resin composition and the crosslinking agent composition were changed to the following, and the mixing ratio of the epoxy resin composition to the crosslinking agent was changed to 50/10.

Epoxy Resin Composition

| | |
|---|---|
| Highly pure bisphenol A type epoxy resin (EPIKOTE YL-980, manufactured by YUKA SHELL EPOXY KK) | 50 |
| Polysulfide modified epoxy resin (FLEP-50, manufactured by TORAY THIOKOL Co., Ltd.) | 50 |
| Titanium oxide (P-25, manufactured by Nippon Aerosil Co.) | 40 |
| Alumina ($Al_2O_3$—C, manufactured by Nippon Aerosil Co.) | 10 |
| Silane coupling agent (KBM403, manufactured by Shin-Etsu Silicone Co., Ltd) | 5 |

Crosslinking Agent Composition

| | |
|---|---|
| Alicyclic amine type crosslinking agent (EPIKURE 113, manufactured by YUKA SHELL EPOXY KK) | 100 |
| Amorphous silica (R-305, manufactured by Nippon Aerosil Co.) | 10 |

Comparative Example 1

The procedures for preparation and evaluation of the sealing agent and the PF-LCD in Example 2 were repeated except that the epoxy resin composition and the crosslinking agent composition were changed to the following, and the mixing ratio of the epoxy resin composition to the crosslinking agent was changed to 100/40.

Epoxy Resin composition

| | |
|---|---|
| Highly pure bisphenol A type epoxy resin (EPIKOTE YL-980, manufactured by YUKA SHELL EPOXY KK) | 70 |
| Alcohol type difunctional epoxy resin (GLYCI-ALE BPP350, manufactured by Sanyo Chemical Industries, Ltd.) | 30 |
| Titanium oxide (P-25, manufactured by Nippon Aerosil Co.) | 20 |
| Amorphous silica (R-805, manufactured by Nippon Aerosil Co.) | 10 |
| Silane coupling agent (KBM403, manufactured by Shin-Etsu Silicone Co., Ltd) | 3 |

Crosslinking Agent Composition

| | |
|---|---|
| Polyamide type amine (TOHMIDE 296, manufactured by FUJI KASEI KOGYO Co., Ltd.) | 100 |

Comparative Example 2

The procedures for preparation and evaluation of the sealing agent and the PF-LCD in Example 2 were repeated except that the epoxy resin composition and the crosslinking agent composition were charged to the following, and the mixing ratio of the epoxy resin composition to the crosslinking agent was changed to 13/1.

Epoxy Resin Composition

| | |
|---|---|
| Highly pure bisphenol A type epoxy resin (EPIKOTE YL-980, manufactured by YUKA SHELL EPOXY KK) | 70 |
| Alcohol type difunctional epoxy resin (GLYCI-ALE BPP350, manufactured by Sanyo Chemical Industries, Ltd.) | 30 |
| Titanium oxide (P-25, manufactured by Nippon Aerosil Co.) | 20 |
| Alumina ($Al_2O_3$—C, manufactured by Nippon Aerosil Co.) | 10 |
| Silane coupling agent (KBM403, manufactured by Shin-Etsu Silicone Co., Ltd) | 5 |

Crosslinking Agent Composition

| | |
|---|---|
| Trifunctional thiol (THIEC-BMPA, manufactured by YODO KAGAKU Co., Ltd.) | 100 |
| Amorphous silica (R-805, manufactured by Nippon Aerosil Co.) | 10 |

Comparative Example 3

The procedures for preparation and evaluation of the sealing agent and the PF-LCD in Example 1 were repeated except that the epoxy resin composition and the crosslinking agent composition were charged to the following, end the mixing ratio of the epoxy resin composition to the crosslinking agent was changed to 56/10.

Epoxy Resin Composition

| | |
|---|---|
| Highly pure bisphenol A type epoxy resin (EPIKOTE YL-980, manufactured by YUKA SHELL EPOXY KK) | 100 |
| Titanium oxide (P-25, manufactured by Nippon Aerosil Co.) | 20 |
| Alumina ($Al_2O_3$—C, manufactured by Nippon Aerosil Co.) | 10 |
| Silane coupling agent (KBM403, manufactured by Shin-Etsu Silicone Co., Ltd) | 5 |

Crosslinking Agent Composition

| | |
|---|---|
| Aromatic amine type crosslinking agent (ANKAMINE Z, manufactured by ACT JAPAN Co., Ltd) | 100 |
| Amorphous silica (R-805, manufactured by Nippon Aerosil Co.) | 5 |

The adhesive strength was so low that the PF-LCD could not be manufactured due to peeling of the sealing agent in the cell-manufacturing process. Therefore the evaluation of the PF-LCD could not be performed.

The results are shown in Table 1.

TABLE 1

| | Resistivity ($\Omega$ cm) | Swelling degree | Adhesive strength (gf/5 mm) | Changing rate of current consumption R/R0 | | Orientation fault | |
|---|---|---|---|---|---|---|---|
| | | | | Condition (1) | Condition (2) | Condition (1) | Condition (2) |
| Example 1 | $3.0 \times 10^{10}$ | 1.00 | 320 | 1.5 | 1.2 | no | no |
| Example 2 | $2.2 \times 10^{10}$ | 1.0 | 360 | 1.7 | 1.2 | no | no |
| Example 3 | $2.6 \times 10^{10}$ | 1.0 | 370 | 1.8 | 1.3 | no | no |
| Example 4 | $1.9 \times 10^{10}$ | 1.0 | 310 | 1.8 | 1.3 | no | no |
| Example 5 | $2.0 \times 10^{10}$ | 1.1 | 390 | 1.9 | 1.5 | no | no |
| Example 6 | $1.5 \times 10^{10}$ | 1.1 | 410 | 1.7 | 1.2 | no | no |
| Example 7 | $1.5 \times 10^{10}$ | 1.1 | 300 | 1.8 | 1.1 | no | no |
| Example 8 | $1.6 \times 10^{10}$ | 1.0 | 420 | 1.6 | 1.0 | no | no |
| Comparative Example 1 | $8.7 \times 10^{8}$ | 1.8 | 360 | 3.2 | 3.2 | yes | yes |
| Comparative Example 2 | $3.5 \times 10^{9}$ | 1.3 | 450 | 3.5 | 2.0 | yes | no |
| Comparative Example 3 | $3.7 \times 10^{10}$ | 1.0 | 80 | — | — | — | — |

As can be clearly understood from Table 1, the sealing agents have good resistance to liquid crystals and good adhesive strength, and the resultant PF-LCD panels of the present invention have good reliability even when preserved under high temperature and high temperature/humidity conditions.

This application is based on Japanese Patent Application No. 09-336491, filed on Nov. 20, 1997, incorporated herein by reference.

Having now fully described the invention, it will be apparent to one of ordinary skill in the art that many changes and modifications can be made thereto without departing from the spirit and scope of the invention as set forth therein.

We claim:

1. A liquid crystal display in film form in which a liquid crystal is sealed therein with a sealing agent;

wherein the sealing agent comprises a combination of epoxy resins comprising a bisphenol epoxy resin and an alcohol epoxy resin selected from the group consisting of polyethylene glycol epoxy resins, propylene glycol epoxy resins and 1,6-hexanediol diglycidylether epoxy resins; and a crosslinking agent which comprises at least one aromatic amine selected from the group consisting of diaminodiphenylmethane (DDM), metaphenylenediamine, diaminodiphenylsulfone, 3,3'-dimethyl-5,5'-diethyl-4,4'-diaminophenylmethane, dimethylethylmethaphenylenediamine, and epoxy-adducts of DDM; and wherein the sealing agent is obtained by mixing said combination with said crosslinking agent.

2. The liquid crystal display according to claim 1, wherein the sealing agent additionally comprises a crosslinking catalyst, and wherein the crosslinking catalyst comprises an acid.

3. The liquid crystal display according to claim 2, wherein the acid comprises a silica.

4. The liquid crystal display according to claim 2, wherein the acid comprises an organic acid.

5. The liquid crystal display according to claim 1, wherein the liquid crystal has dielectric anisotropy of not less than 10 and a threshold voltage (Vth) not greater than 1.51 V.

* * * * *